United States Patent
Yang et al.

(10) Patent No.: US 9,945,570 B2
(45) Date of Patent: Apr. 17, 2018

(54) UNIT AND METHOD FOR COOLING, AND APPARATUS AND METHOD FOR TREATING SUBSTRATE

(71) Applicant: PSK INC., Gyeonggi-do (KR)

(72) Inventors: Seung-Kook Yang, Hwaseong-si (KR); Seong-wook Lee, Hwaseong-si (KR); Dae-hee Son, Hwaseong-si (KR)

(73) Assignee: PSK Inc., Gyeonggi-do (KR)

( * ) Notice: Subject to any disclaimer, the term of this patent is extended or adjusted under 35 U.S.C. 154(b) by 696 days.

(21) Appl. No.: 14/304,368

(22) Filed: Jun. 13, 2014

(65) Prior Publication Data

US 2014/0377039 A1 Dec. 25, 2014

(30) Foreign Application Priority Data

Jun. 20, 2013 (KR) .................. 10-2013-0071061

(51) Int. Cl.
| | |
|---|---|
| *F25B 19/00* | (2006.01) |
| *F24F 9/00* | (2006.01) |
| *H01L 21/67* | (2006.01) |

(52) U.S. Cl.
CPC .......... *F24F 9/00* (2013.01); *H01L 21/67109* (2013.01); *H01L 21/67201* (2013.01)

(58) Field of Classification Search
CPC . H01L 21/67109; H01L 21/67201; F24F 9/00
See application file for complete search history.

(56) References Cited

U.S. PATENT DOCUMENTS

| | | | | |
|---|---|---|---|---|
| 2004/0089235 | A1* | 5/2004 | Yamada | ..................... B01F 3/02 118/715 |
| 2007/0084562 | A1* | 4/2007 | Tsujimoto | ........... H01J 37/3244 156/345.24 |
| 2009/0104351 | A1* | 4/2009 | Kakegawa | .............. C23C 16/34 427/248.1 |
| 2011/0168330 | A1* | 7/2011 | Sakaue | ............. H01L 21/67109 156/345.31 |

FOREIGN PATENT DOCUMENTS

| | | |
|---|---|---|
| JP | 05175162 B2 | 7/1993 |
| KR | 102005012049 A | 12/2005 |
| KR | 100855325 B1 | 9/2008 |
| KR | 1020130064493 A | 6/2013 |

* cited by examiner

*Primary Examiner* — Elizabeth Martin
(74) *Attorney, Agent, or Firm* — Harness, Dickey & Pierce, P.L.C.

(57) ABSTRACT

Provided is a substrate treating apparatus. The substrate treating apparatus includes an equipment front end module, a loadlock chamber, a transfer chamber, and a plurality of process chambers. The loadlock chamber includes a cooling unit for cooling a substrate treated in the process chambers, and the cooling unit includes a cooling chamber having an inner space, the cooling chamber having a gas inflow hole in one surface thereof, wherein support pins on which the substrate is placed are disposed around a circumference of the gas injection hole, a cooling gas injection part supplying a cooling gas toward the gas inflow hole, and a gas exhaust part exhausting the cooling gas supplied into the cooling chamber and fumes generated from the substrate to the outside of the cooling chamber.

14 Claims, 21 Drawing Sheets

UNIT AND METHOD FOR COOLING, AND APPARATUS AND METHOD FOR TREATING SUBSTRATE

CROSS-REFERENCE TO RELATED APPLICATIONS

This U.S. non-provisional patent application claims priority under 35 U.S.C. § 119 of Korean Patent Application No. 10-2013-0071061, filed on Jun. 20, 2013, the entire contents of which are hereby incorporated by reference.

BACKGROUND OF THE INVENTION

In general, semiconductors are manufactured by successively performing a series of unit processes such as layer formation, pattern formation, metal interconnection formation, and the like. Semiconductor manufacturing equipment may include a loadport, an equipment front end module (EFEM), a loadlock chamber, a transfer chamber, and a process chamber. The loadport supports a carrier in which a substrate is accommodated, and the EFEM includes a transfer robot for transferring the substrate between the loadport and the chambers. A treated substrate before being transferred into the loadport or a substrate to be treated before being transferred into the process chamber may stand by in the loadlock chamber. The transfer chamber transfers a substrate between the loadlock chamber and the process chamber.

The substrate is heated at a high temperature while the substrate is treated. Then, the heated substrate may be provided in the loadlock chamber. The substrate may be cooled in the loadlock chamber before being accommodated into the carrier.

The cooling process may be performed by using conduction and convection. The conduction method may cause thermal stress on the substrate and generate particles. The convection method may be mainly performed under the atmospheric state to reduce occurrences of the thermal stress and particles. However, according to the convection method, a cooling rate may decrease to reduce a process treating rate.

PRIOR ART DOCUMENTS

Patent Documents

Korean Patent Registration No. 10-0855325

SUMMARY OF THE INVENTION

The present invention provides a substrate treating apparatus that is capable of quickly uniformly cooling a substrate.

The present invention also provides a substrate treating apparatus that is capable of minimizing a generation of particles.

Embodiments of the present invention provide substrate treating apparatuses including: an equipment front end module; a loadlock chamber; a transfer chamber; and a plurality of process chambers, wherein the loadlock chamber includes a cooling unit for cooling a substrate treated in the process chambers, and the cooling unit includes: a cooling chamber having an inner space, the cooling chamber having a gas inflow hole in one surface thereof, wherein support pins on which the substrate is placed are disposed around a circumference of the gas injection hole; a cooling gas injection part supplying a cooling gas toward the gas inflow hole; and a gas exhaust part exhausting the cooling gas supplied into the cooling chamber and fumes generated from the substrate to the outside of the cooling chamber.

In some embodiments, the gas injection part may include: a gas injection block in which injection holes for injecting the cooling gas toward the gas inflow hole are defined, and a diffusion space communicating with the injection holes is defined therein, the gas injection block having a radius greater than that of the substrate; and a gas supply line connected to the gas injection block to supply the cooling gas into the diffusion space.

In other embodiments, air curtain holes may be defined along an edge area of the gas injection block with the injection holes therein, and the air inflow holes may be vertically defined in the same line as the air curtain holes in one surface of the cooling chamber facing the edge area of the gas injection block.

In still other embodiments, the air curtain holes may be arranged in a zigzag form along a circumference of the gas injection block.

In even other embodiments, a partition plate for partitioning the diffusion space into a central region corresponding to the area in which the injection holes are defined and an edge region surrounding the central region to correspond to the area in which the air curtain holes are defined may be disposed within the gas injection block, and the gas supply line may include: a first line supplying a gas into the central region; and a second line supplying a gas into the edge region.

In yet other embodiments, the second line may supply the gas at a pressure greater than that of the first line.

In further embodiments, the gas injection block may include an injection part connected to the second line and having a passage that gradually increases in diameter in a direction away from the second line, and a distribution block that divides a flow of the gas supplied from the second line into two flows may be disposed in the injection part.

In still further embodiments, the distribution block may include: a first surface; and a second surface that is angled at a predetermined angle with respect to the first surface, wherein an edge of the distribution block, which is defined by the first and second surfaces that meet each other, may face a direction of the gas introduced into the injection part.

In even further embodiments, the inner space of the cooling chamber may be defined above the substrate placed on the support pins, and the gas injection block may supply the cooling gas at a lower portion of the cooling chamber.

In yet further embodiments, the inner space of the cooling chamber may be defined under the substrate placed on the support pins, the gas exhaust part may exhaust the gas through an inflow hole defined in a lower wall of the cooling chamber, and the gas injection block may supply the cooling gas onto a rear surface of the substrate in the inner space of the cooling chamber.

In much further embodiments, the inner space of the cooling chamber may be defined under the substrate placed on the support pins, the gas exhaust part may exhaust the gas through an inflow hole defined in a lower wall of the cooling chamber, and the gas injection block may supply the cooling gas onto a front surface of the substrate in the inner space of the cooling chamber.

In still much further embodiments, the gas exhaust part may include a partition part partitioning the inner space of the cooling chamber into a first region facing the substrate and a second region surrounding the first region between the partition part and an inner side surface of the cooling chamber, the partition part having one surface in which the exhaust holes through which fumes generated from the substrate are exhausted are defined to face the substrate.

In even much further embodiments, the partition part may include: a first partition wall in which the exhaust holes are defined, the first partition wall being disposed under an upper wall of the cooling chamber to face the substrate; and a second partition wall extending downward from an edge area of the first partition wall, the second partition wall having a ring shape that is spaced a predetermined distance from a sidewall of the cooling chamber, wherein the second partition wall may have a radius less than that of the substrate.

In yet much further embodiments, the gas exhaust part may include: a gas exhaust line connected to an inflow hole defined in a center of an upper wall of the cooling chamber to introduce the gas within the cooling chamber, thereby exhausting the gas to the outside; and partition plates radially disposed with respect to the inflow hole to partition the second region into a plurality of spaces.

In much still further embodiments, the partition plates may be disposed at the same interval along a circumference of the inflow hole.

In other embodiments of the present invention, substrate treating methods include: transferring a substrate treated in a process chamber into a loadlock chamber; and cooling the substrate while the substrate stands by in the loadlock chamber, wherein a cooling chamber is formed within the loadlock chamber and has one surface in which a gas inflow hole is formed, wherein support pins are formed along a circumference of the gas inflow hole, the substrate is placed on upper ends of the support pins, a cooling gas is supplied from injection holes of a gas injection block facing the substrate toward the gas inflow hole, and the cooling gas is introduced into the cooling chamber through a space between the support pins and exhausted to the outside of the cooling chamber through a gas exhaust line.

In some embodiments, air curtain holes may be formed in an edge area of the gas injection block, and air inflow holes are formed in one surface of the cooling chamber to face the air curtain holes, a gas injected from the air curtain holes may be introduced into the air inflow holes to form an air curtain, and the air curtain may surround a periphery of the cooling gas injected from the injection holes.

In other embodiments, an inner space of the gas injection block may be partitioned into a central region communicating with the injection holes and an edge region surrounding the central region to communicate with the air curtain holes, the gas may be supplied into the central region at a first pressure, and the gas may be supplied into the edge region at a second pressure greater than the first pressure.

In still other embodiments, a partition part partitioning an inner space of the cooling chamber into a first region facing the substrate and a second region surrounding the first region between the partition part and an inner side surface of the cooling chamber and having one surface, in which exhaust holes are formed, facing the substrate may be disposed within the cooling chamber, the most cooling gas introduced into the cooling chamber may flow along the second region, and the most fumes generated from the substrate may flow along the first region and be introduced into the exhaust holes.

In still other embodiments of the present invention, cooling units include: a cooling chamber having an inner space, the cooling chamber having a gas inflow hole in one surface thereof, wherein support pins on which the substrate is placed are disposed around a circumference of the gas injection hole; a gas injection block disposed adjacent to the gas inflow hole, the gas injection block having one surface, in which injection holes for injecting a cooling gas are defined, facing the substrate placed on the support pins; and a gas exhaust part exhausting the cooling gas supplied into the cooling chamber and fumes generated from the substrate to the outside of the cooling chamber.

In some embodiments, the gas injection block may have a radius greater than that of the substrate, and air curtain holes are defined along a circumference of the gas injection block outside the injection holes, and the cooling chamber may have air injection holes defined along the circumference of the gas inflow hole and vertically disposed on the same line as the air curtain holes.

In other embodiments, the inside of the gas injection block may be provided as spaces that are partitioned into a central region corresponding to the area in which the injection holes are defined and an edge region surrounding the central region to correspond to the area in which the air curtain holes are defined, and the cooling units may further include: a first line supplying a gas into the central region; and a second line supplying a gas into the edge region.

In still other embodiments, the gas injection block may include an injection part connected to the second line and having a passage that gradually increases in diameter in a direction away from the second line, and a distribution block that divides a flow of the gas supplied from the second line into two flows may be disposed in the injection part.

In even other embodiments, the exhaust part may include: a first partition wall in which the exhaust holes are defined, the first partition wall being disposed under an upper wall of the cooling chamber to face the substrate; and a second partition wall extending downward from an edge area of the first partition wall, the second partition wall having a ring shape that is spaced a predetermined distance from a sidewall of the cooling chamber, wherein the second partition wall may have a radius less than that of the substrate.

In yet other embodiments, the gas exhaust part may include: a gas exhaust line connected to an inflow hole defined in a center of an upper wall of the cooling chamber to introduce the gas within the cooling chamber, thereby exhausting the gas to the outside; and partition plates radially disposed with respect to the inflow hole in a space between the upper wall of the cooling chamber and the first partition wall to partition the space between the upper wall of the cooling chamber and the first partition wall into a plurality of spaces.

In even other embodiments of the present invention, cooling methods include: providing a substrate into a cooling chamber having one surface, in which a gas inflow hole is formed, to seat the substrate on upper ends of support pins, wherein the support pins are formed along a circumference of the gas inflow hole; supplying a cooling gas from injection holes of a gas injection block facing the substrate toward the gas inflow hole; and exhausting the cooling gas introduced into the cooling chamber to the outside of the cooling chamber through a gas exhaust line.

In some embodiments, air curtain holes may be formed along a circumference of the air injection hole in an edge area of the gas injection block, and air inflow holes are formed in one surface of the cooling chamber to face the air curtain holes, and a gas injected from the air curtain holes may be introduced into the air inflow holes to form an air curtain, wherein the air curtain may surround a periphery of the cooling gas injected from the injection holes.

In other embodiments, an inner space of the gas injection block may be partitioned into a central region communicating with the injection holes and an edge region surrounding the central region to communicate with the air curtain holes, the gas may be supplied into the central region at a first pressure, and the gas may be supplied into the edge region at a second pressure greater than that of the first pressure.

In still other embodiments, a partition part partitioning an inner space of the cooling chamber into a first region facing the substrate and a second region surrounding the first region between the partition part and an inner side surface of the cooling chamber and having one surface, in which exhaust holes are formed, facing the substrate may be disposed within the cooling chamber, the most cooling gas introduced into the cooling chamber may flow along the second region, and the most fumes generated from the substrate may flow along the first region and be introduced into the exhaust holes.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
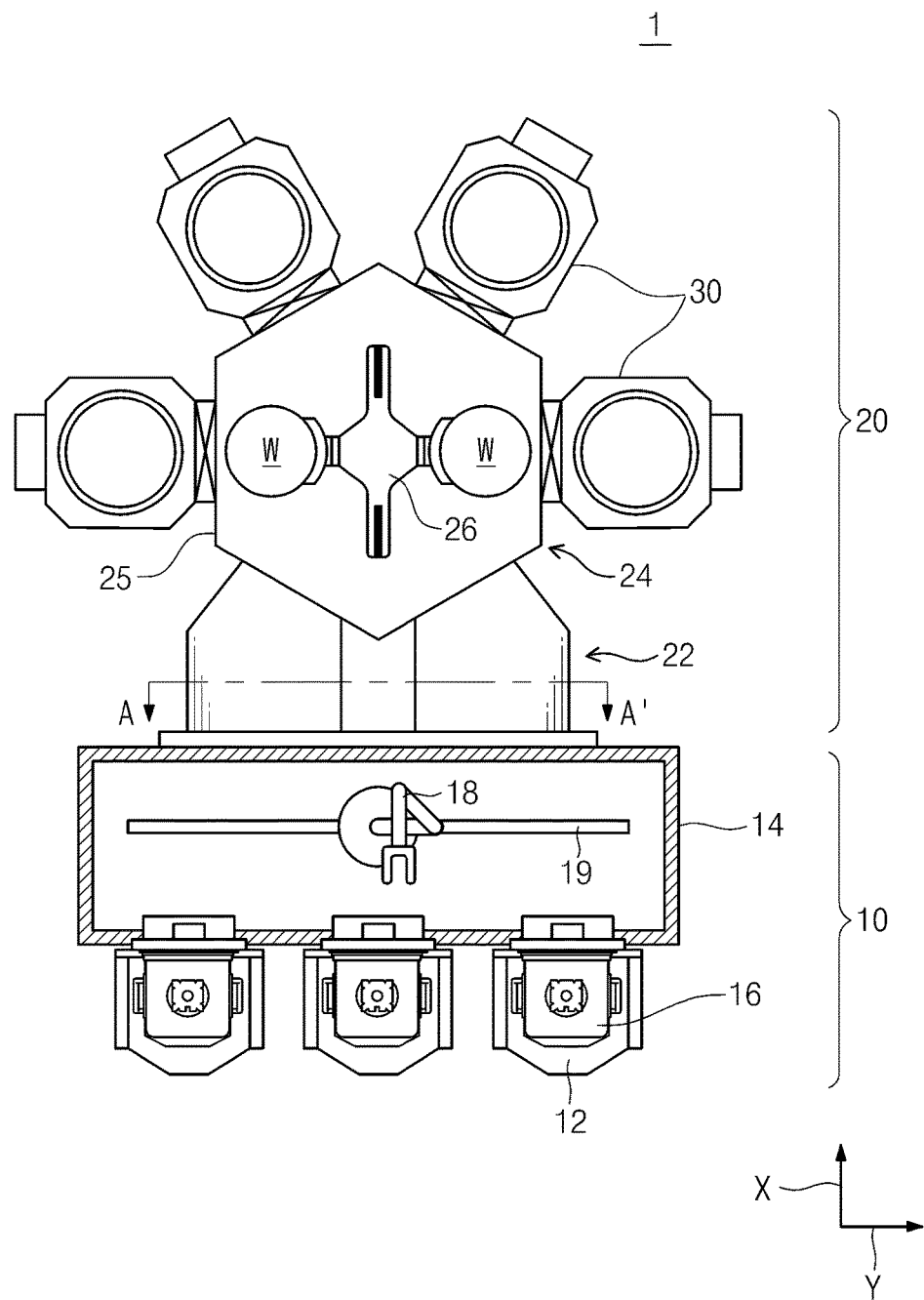
FIG. 1 is a schematic plan view of a substrate treating equipment according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

FIG. 1 is a schematic plan view of a substrate treating equipment according to an embodiment of the present invention.

Referring to FIG. 1, a substrate treating apparatus 1 includes an equipment front end module (EFEM) 10 and a process treating chamber 20. The EFEM 10 and the process treating chamber 20 may be arranged in one direction. Hereinafter, the direction in which the EFEM 10 and the process treating chamber 20 are arranged may be defined as a first direction X, and when viewed from an upper side, a direction perpendicular to the first direction X may be defined as a second direction Y.

The EFEM 10 may be mounted on a front side of the process treating chamber 20 to transfer a substrate W between a carrier 16 in which the substrate is accommodated and the process treating chamber 20. The EFEM 10 includes a loadport and a frame 14.

The loadport 12 may be disposed on a front side of a frame 14 and provided in plurality. The loadports 12 may be spaced apart from each other and arranged along the second direction Y. The carrier 16 (for example, a cassette, a FOUP, etc.) may be seated on each of the loadports 12. A substrate W to be treated and a treated substrate W may be accommodated into the carrier 16.

The frame 14 is disposed between the loadport 12 and the loadlock chamber 22. A transfer robot 18 for transferring the substrate W between the loadport 12 and the loadlock chamber 22 is disposed within the frame 14. The transfer robot 18 may move along a transfer rail 19 that is disposed in the second direction Y.

The process treating chamber 20 may include a loadlock chamber 22, a transfer chamber 24, and a plurality of process chambers 30.

The loadlock chamber 22 is disposed between the transfer chamber 24 and the frame 14 to provide a space in which the substrate to be treated before being transferred into the process chamber 30 and the treated substrate W before being transferred into the carrier 16 stands by. The loadlock chamber 22 may be provided in one or plurality. In the current embodiment, the loadlock chamber 22 is provided in two.

The transfer chamber 24 is disposed on a rear side of the loadlock chamber 22 along the first direction X. When viewed from an upper side, the transfer chamber 24 may include a main body 25 having a polygonal shape. The loadlock chambers 22 and the plurality of process chambers 30 are disposed outside the main body 25 along a circumference of the main body 25. According to the current embodiment, the transfer chamber 24 may include a main body having a pentagonal shape. The loadlock chambers 22 are disposed on two sidewalls adjacent to the EFEM 10, respectively. The process chambers 30 are disposed on remaining sidewalls. A passage (not shown) through which the substrate is loaded and unloaded may be defined in each of the sidewalls of the main body 25. The passage may provide a space through which the substrate W is loaded or unloaded between the transfer chamber 24 and the loadlock chamber 22 or between the transfer chamber 24 and the process chamber 30. A door (not shown) for opening or closing the passage may be provided in each of the passages. The transfer chamber 24 may have various shapes according to a required process module.

A conveyance robot 26 is disposed within the transfer chamber 24. The conveyance robot 26 may transfer the non-treated substrate W standing by in the loadlock chamber 22 into the process chamber 30 or transfer the substrate W that is completely treated in the process chamber 30 into the loadlock chamber 22. The conveyance robot 26 may successively provide the substrate W into the process chambers 30.

A substrate treating process may be performed in the process chamber 30. A plasma gas may be supplied onto the substrate W to perform the substrate treating process in the process chamber 30. According to the current embodiment, an ashing process, an etching process, a deposition process, and the like may be performed in the process chamber 30.

Figure 2:
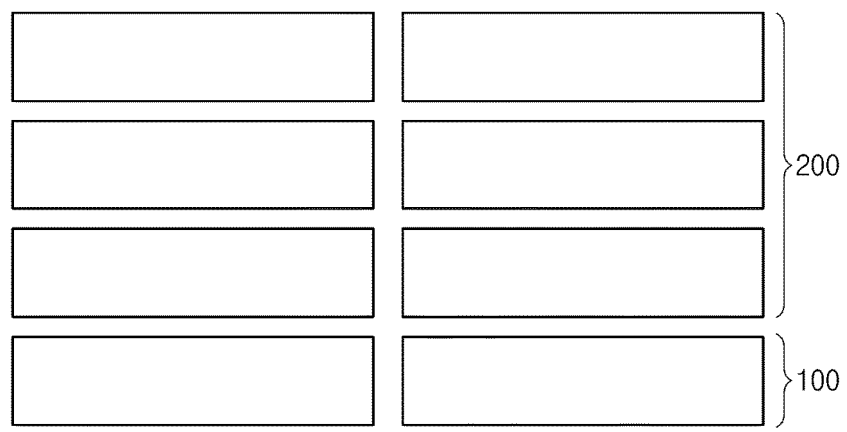
FIG. 2 is a schematic cross-sectional view taken along line A-A' of FIG. 1.

FIG. 2 is a schematic cross-sectional view taken along line A-A' of FIG. 1.

Referring to FIGS. 1 and 2, the loadlock chamber 22 includes a standby unit 100 and a cooling unit 200. The loadlock chambers 22 are vertically arranged in two rows. Here, the standby unit 100 and the cooling unit 200 are disposed in each row. The standby unit 100 may provide a space in which the substrate W to be treated stands by before being transferred into the process chamber 30. The cooling unit 200 may provide a space in which the treated substrate W stands by before being transferred into the carrier 16. The cooling unit 200 may quickly cool the substrate that is heated at a temperature greater than that room temperature during the process. The standby unit 100 and the cooling unit 200 may be vertically stacked on each other. According to the current embodiment, one standby unit 100 may be provided in a lower region of each of the loadlock chambers 22, and a plurality of cooling units 200 may be stacked on the standby unit 100. Three cooling units 200 may be stacked in each row. The standby unit 100 and the cooling unit 200 may be variously changed in number and arrangement.

Figure 3:
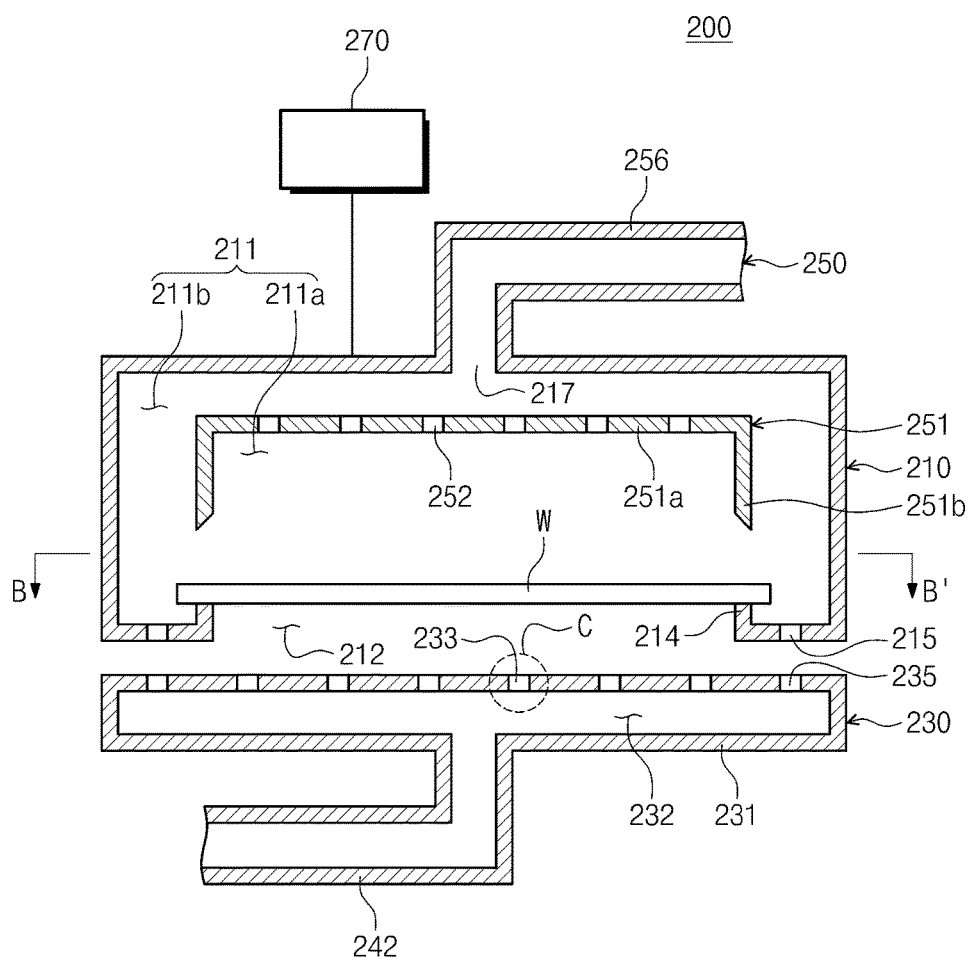
FIG. 3 is a schematic cross-sectional view of a cooling unit according to an embodiment of the present invention.
Figure 4:
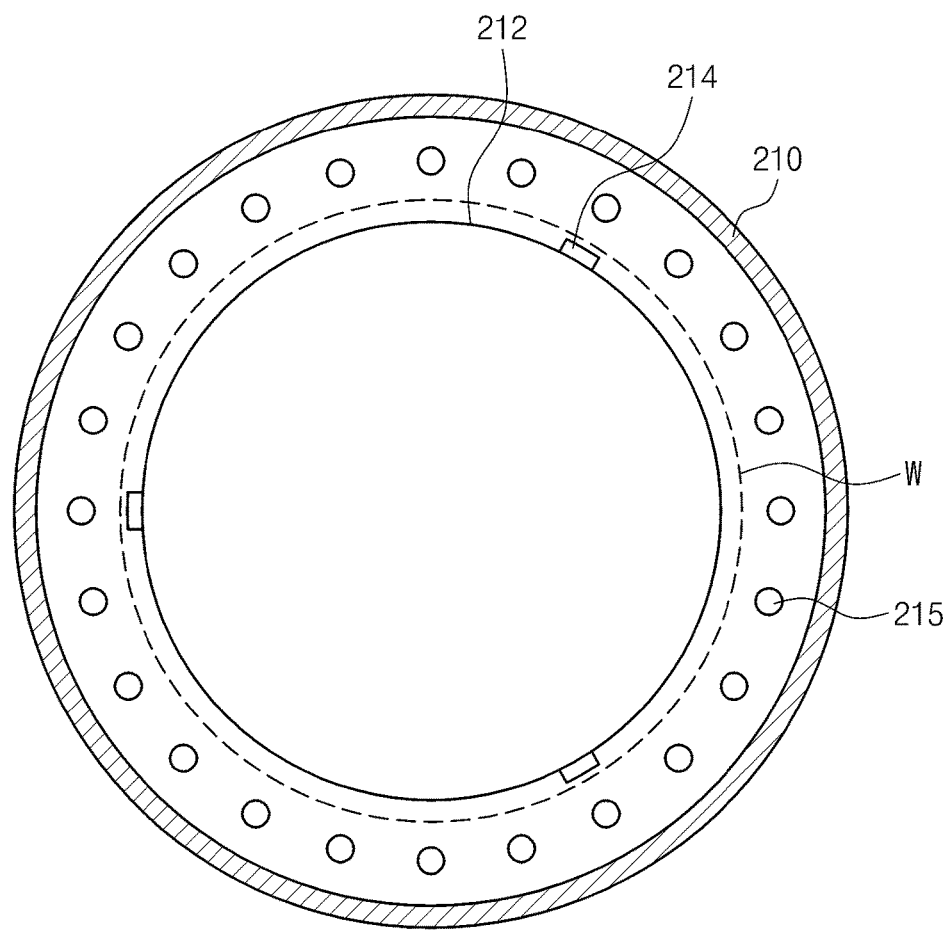
FIG. 4 is a cross-sectional view taken along line B-B' of FIG. 3.

FIG. 3 is a schematic cross-sectional view of the cooling unit according to an embodiment of the present invention, and FIG. 4 is a cross-sectional view taken along line B-B' of FIG. 3.

Referring to FIGS. 3 and 4, the cooling unit includes a cooling chamber 210, a cooling gas injection part 230, a gas exhaust part 250, and a driving part 270. The cooling chamber 210 provides a space in which a process of cooling the substrate W is performed, and the cooling gas injection part 230 supplies a cooling gas onto the substrate W. The gas exhaust part 250 may exhaust the cooling gas supplied into the cooling chamber 210 and fumes generated while cooling the substrate W to the outside of the cooling chamber 210.

The cooling chamber 210 may have an inner space, and a gas inflow hole 212 may be defined in one surface of the cooling chamber 210. The gas inflow hole 212 may be defined in a lower wall of the cooling chamber 210 to communicate with the inner space 211. The gas inflow hole 212 may be provided as a circular hole having a radius less than that of the substrate W. Support pins 214 may be disposed on the cooling chamber 210. The support pins 214 may be disposed adjacent to the gas inflow hole 212 and spaced apart from each other along a circumference of the gas inflow hole 211 to protrude upward from the lower wall of the cooling chamber 210 by a predetermined height. The substrate W is placed on upper ends of the support pins 214.

Air inflow holes 215 are defined in the lower wall of the cooling chamber 210. The air inflow holes 215 may be defined outside the gas inflow hole 212 with a radius greater than that defined by the support pins 214. The air inflow holes 215 may be arranged in the same vertical line as air injection holes 235 that will be described later. The air inflow holes 215 may be provided as through-holes connecting the inside and outside of the cooling chamber 210 to each other.

An inflow hole 217 is defined in an upper wall of the cooling chamber 210. The inflow hole 217 is connected to the gas exhaust part 250 to provide a passage through which a gas within the cooling chamber 210 is exhausted to the outside.

The cooling gas injection part 230 includes a gas injection block 231 and a gas supply line 241. The gas injection block 231 may have a circular plate having a predetermined thickness. Also, the gas injection block 231 has one surface facing the gas inflow hole 212. According to the current embodiment, the gas injection block 231 may be disposed under the cooling chamber 210 and have a top surface facing the gas inflow hole 212. The gas injection block 231 has a radius greater than that of the gas inflow hole 212. A diffusion space 232 is defined inside the gas injection block 231. Also, injection holes 233 and air curtain holes 235 are defined in one surface of the gas injection block 231 facing the gas inflow hole 212. The injection holes 233 and the air curtain holes 235 communicate with the diffusion space 232.

Figure 5:
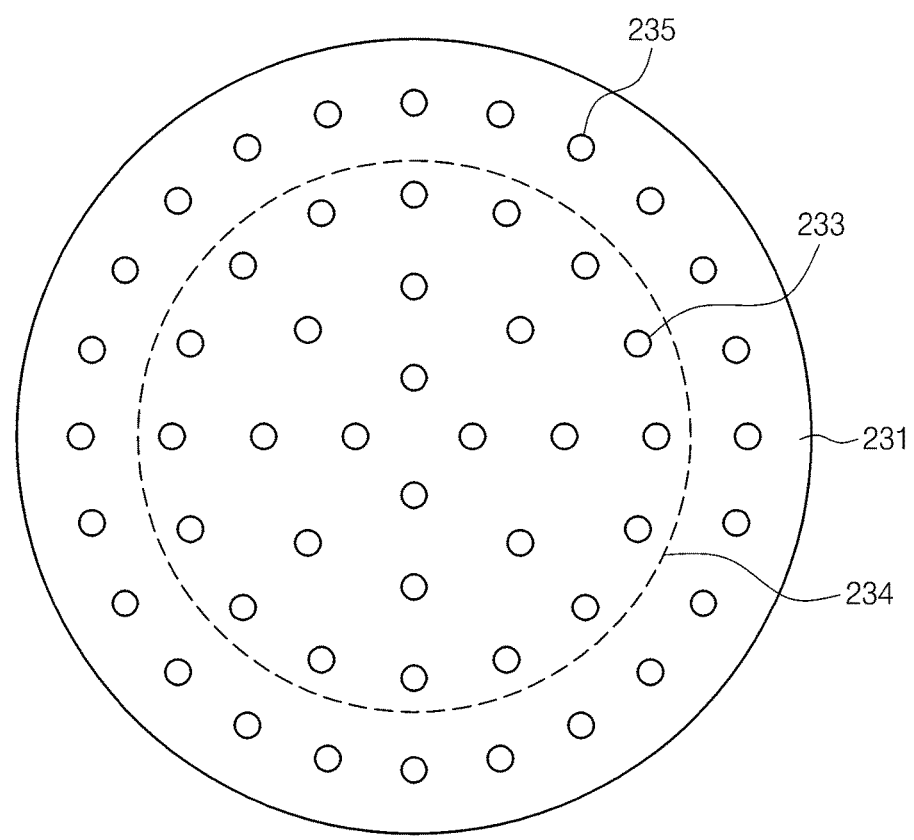
FIG. 5 is a view illustrating a top surface of a gas injection block according to an embodiment of the present invention.

FIG. 5 is a view illustrating a top surface of a gas injection block according to an embodiment of the present invention.

Referring to FIG. 5 the injection holes 233 may be uniformly defined in a predetermined radius area from the gas injection block 231. The area in which the injection holes 233 are defined may have a radius that corresponds to or greater than that of the gas inflow hole 212.

The air curtain holes 235 may be defined along a circumference of the area 234 in which the injection holes 233 are defined. The air curtain holes 235 may be defined along an edge of the gas injection block 231.

Figure 6:
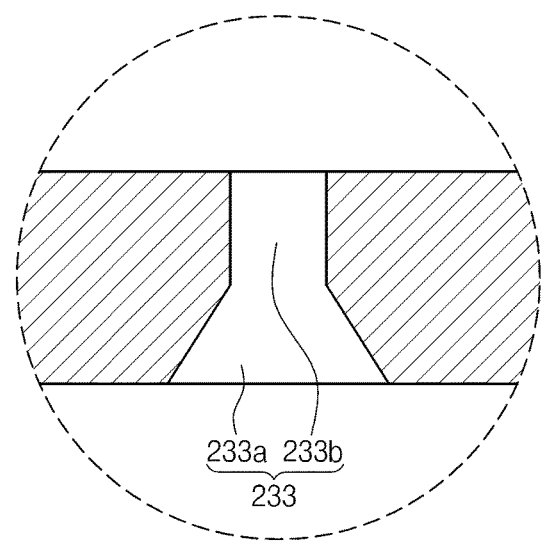
FIGS. 6 and 7 are views illustrating a region of FIG. 3 according to various embodiments of the present invention.
Figure 7:
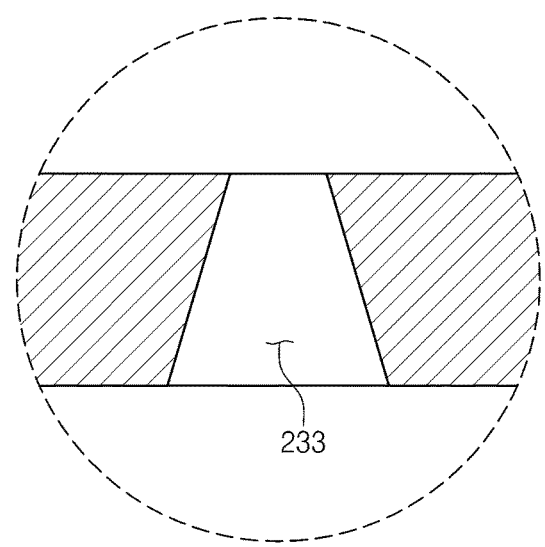

FIGS. 6 and 7 are views illustrating a region "C" of FIG. 3 according to various embodiments of the present invention.

Referring to FIG. 6, the injection hole 233 may have radii different from each other in upper and lower areas 233a and 233b thereof. The upper area 233a may have a circular hole with the same radius. The lower area 233b may have a hopper shape that gradually increases in radius downward. The lower area 233b of the injection hole 233 may have a shape that is capable of easily injecting the cooling gas therein.

Referring to FIG. 7, the injection hole 233 may have a radius that gradually decreases upward from a lower side thereof.

The shape of the injection hole 233 is not limited to the shapes of FIGS. 6 and 7. Thus, the injection hole 233 may vary in shape.

Referring again to FIG. 3, the gas supply line 242 may be connected to the gas injection block 231 to supply the cooling gas into the diffusion space 232. The cooling gas may be diffused into the diffusion space 232. Here, the most cooling gas may be supplied into the gas injection hole 212 through the injection holes 233, and a portion of the cooling gas may be supplied into the cooling chamber 210 through the air curtain holes 235.

The gas exhaust part 250 includes a partition part 251 and a gas exhaust line 256.

The partition part 251 is disposed within the cooling chamber 210 to partition the inside of the cooling chamber 210 into a first region 211a and a second region 211b. The first region 211a may be a space facing the substrate W placed on the support pins 214 and defined above the substrate W. The second region 211b may surround the first region 211a between the partition part 251 and an inner side surface of the cooling chamber 210.

The partition part 251 has a first partition wall 251a and a second partition wall 251b. The first partition wall 251a has a predetermined radius. Also, the first partition wall 251a may have a circular plate having a thin thickness. The first partition wall 251a is spaced a predetermined distance from the upper wall of the cooling chamber 210. Exhaust holes 252 are defined in the first partition wall 251a. The exhaust holes 252 may be provided as through-holes and uniformly defined in each area of the first partition wall 251a.

The second partition wall 251b extends downward from an edge of the first partition wall 251a. The second partition wall 251b may have a cylindrical shape with a bottom surface opened. A lower end of the second partition wall 251b may be spaced a predetermined distance from the substrate W. The second partition wall 251b may be spaced a predetermined distance form the inner side surface of the process chamber 210.

The second partition wall 251b may have a radius less than that of the substrate W.

An inner space defined by the first and second partition walls 251a and 251b may be defined as the first region 211a, and a space between the inner side surface of the process chamber 210 and the partition part 251 may be defined as the second region 211b.

The gas exhaust line 256 is connected to a central area of the upper wall of the cooling chamber 210. The gas exhaust line 256 may apply a vacuum pressure into the cooling chamber 210 through the inflow hole 217. The gas exhaust line 256 may provide a passage through which the gas exhausted from the cooling chamber 210 moves to the outside.

The driving part 270 may move one of the cooling chamber 210 and the gas injection block 231 to adjust a distance between the cooling chamber 210 and the gas injection block 231. According to the current embodiment, the driving part 270 may elevate the cooling chamber 210 to adjust a distance between the cooling chamber 210 and the gas injection block 231.

Figure 8:
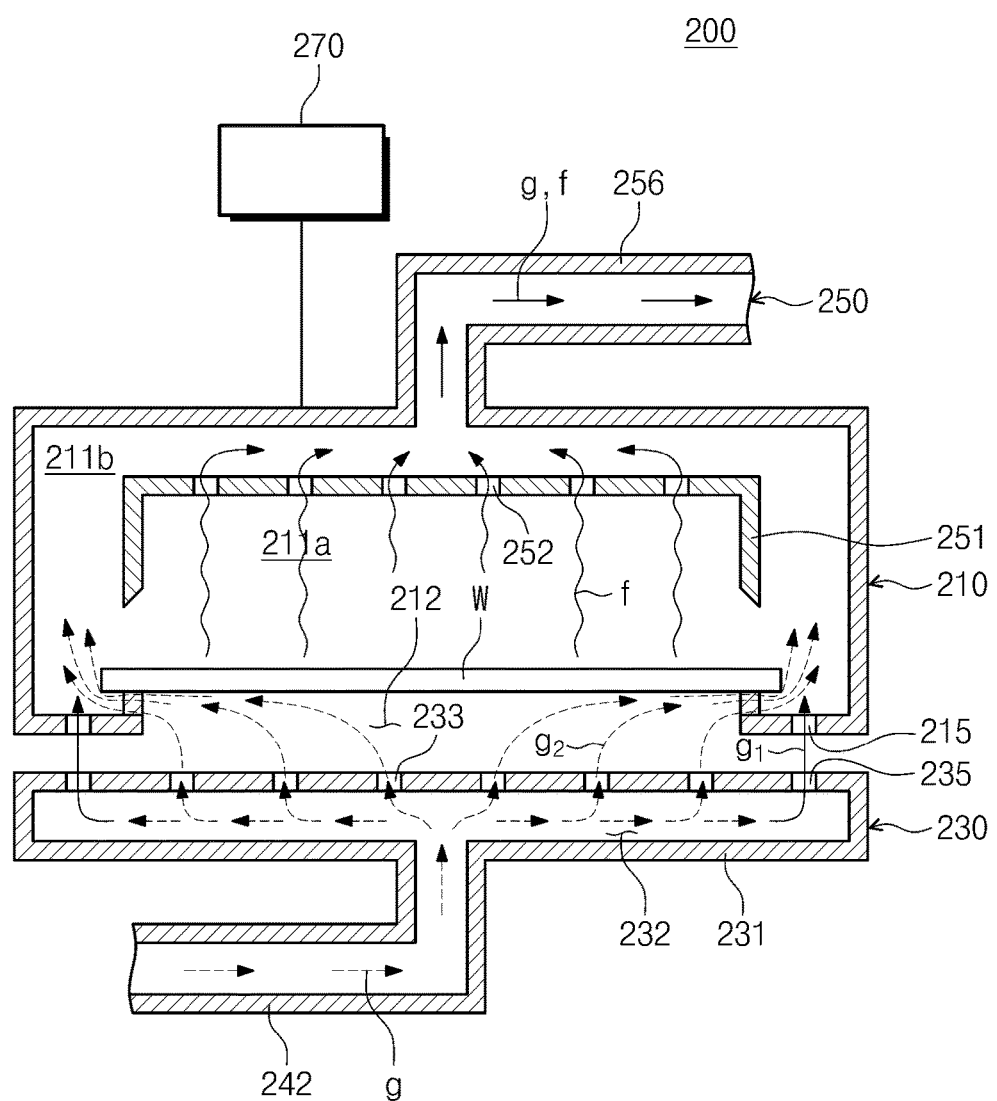
FIG. 8 is a view of a state in which a substrate is cooled according to an embodiment of the present invention.

FIG. 8 is a view of a state in which a substrate is cooled according to an embodiment of the present invention.

Referring to FIG. 8, a cooling gas g may be supplied into the diffusion space 232 of the gas injection block 231 through the gas supply line 242. The cooling gas g may be diffused into the diffusion space 232. Here, the most cooling gas g may be supplied into the gas inflow hole 212 through the injection holes 233. The cooling gas g may be bumped against the substrate W and then introduced into the cooling chamber 210 through a space between the substrate W and the support pins 214. Since the partition part 251 has a radius less than that of the substrate W, the introduction of the cooling gas g into the first region 211a may be restricted. The most cooling gas g may move into the second region 211b by the vacuum pressure that is applied through the gas exhaust line 256. Since the cooling gas g is exhausted to the outside of the cooling chamber 210 while being supplied into the cooling chamber 210, the cooling gas g may flow at a quick flow rate within the cooling chamber 210. The forced convection of the cooling gas g may cool the substrate W and generate fumes on the top surface of the substrate W while cooling the substrate W.

The partition part 251 may guide the forced convection of the cooling gas g into the second region 211b to minimize the introduction of particles, which are generated while cooling the substrate W, onto the substrate W.

A cooling gas g1 discharged from the air curtain holes 235 may linearly move upward and then be introduced into the air inflow holes 215. The cooling gas g1 may form an air curtain in a space between the cooling chamber 210 and the gas injection block 231. The air curtain g1 may have a ring shape along a periphery of a cooling gas g2 supplied into the gas inflow hole 212 through the injection holes 233. Since the cooling gas g2 supplied into the gas inflow hole 212 through the injection holes 233 has a pressure less than that of the surrounding pressure, the surrounding air may be introduced into the gas inflow hole 212 together with the cooling gas g2. The air curtain g1 may block the introduction of the surrounding air into the gas inflow hole 212 to minimize the introduction of the external particles into the cooling chamber 210.

Figure 9:
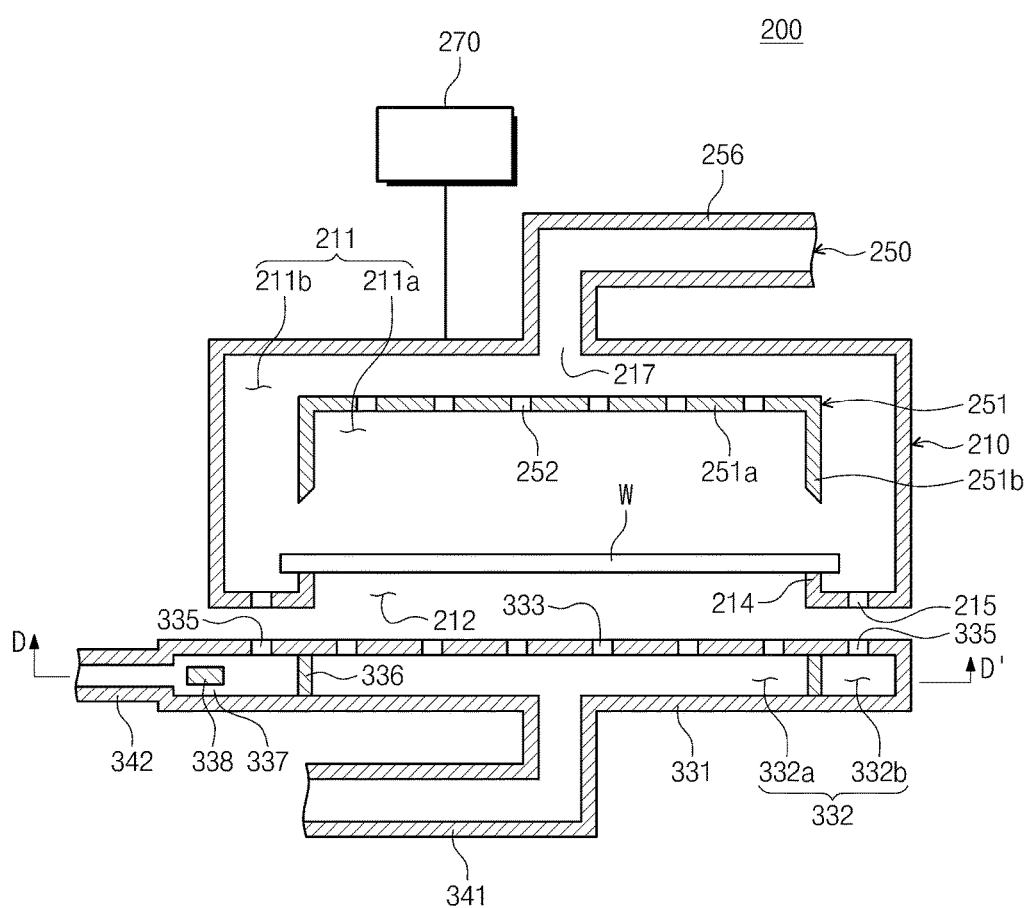
FIG. 9 is a view of a cooling unit according to another embodiment of the present invention.
Figure 10:
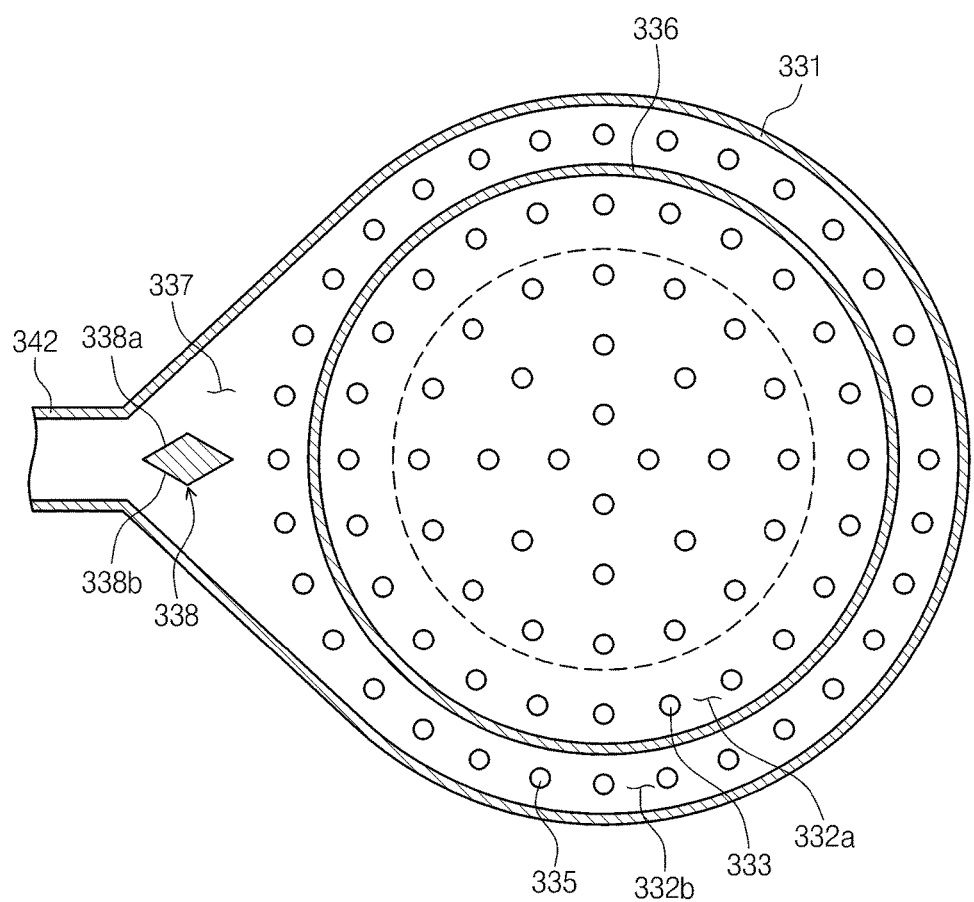
FIG. 10 is a cross-sectional view taken along line D-D' of FIG. 9.

FIG. 9 is a view of a cooling unit according to another embodiment of the present invention, and FIG. 10 is a cross-sectional view taken along line D-D' of FIG. 9.

Referring to FIGS. 9 and 10, a partition plate 336 is disposed within a gas injection block 331. The partition plate 336 may have a ring-shaped plate having a predetermined radius to partition a diffusion space 332 into a central region 332a and an edge region 332b. The central region 332a may be a space that corresponds to a region defined by injection holes 333 to communicate with the injection holes 333. The edge region 332b may be a space that corresponds to a region defined by air curtain holes 335 to surround the central region 332a.

The gas injection block includes an injection part 337. The injection part 337 may be connected to the gas injection block 331 and the gas supply line 342. Also, the injection part 337 may have a passage that gradually increases in a direction away from the gas supply line 342. The injection part 337 communicates with the edge region 332b.

The gas supply line 341 342 includes a first line 341 and a second line 342. The first line 341 is connected to the central region 332a of the gas injection block 331 to supply a cooling gas into the central region 332a. The second line 342 is connected to the injection part 337 to supply a gas into the edge region 332b. The second line 342 may supply the same gas as that supplied through the first line 341. On the other hand, the second line 342 may supply a gas different from that supplied through the first line 341. The second line 342 may supply the gas at a pressure greater than that of the first line 341.

Figure 11:
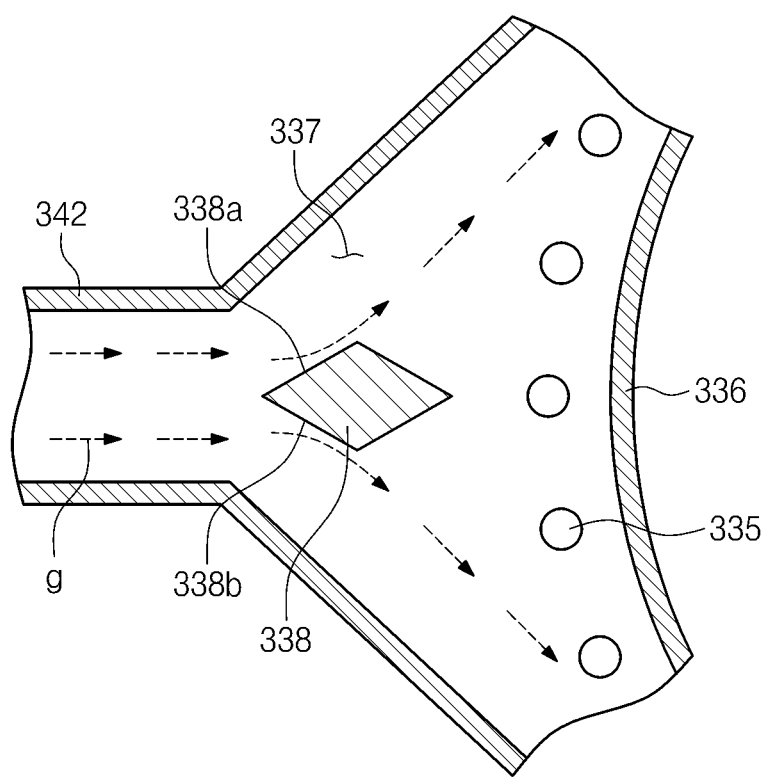
FIG. 11 is a view illustrating a process of supplying a gas into a injection part according to an embodiment of the present invention.

A distribution block 338 is disposed in the injection part 337. The distribution block 338 may divide a flow of the gas supplied from the second line 342 into two gas flows. The distribution block 338 may have first and second surfaces 338a and 338b, which are angled with respect to each other by a predetermined angle. One edge of the distribution block 338 at which the first and second surfaces 338a and 338b meets each other may face a flow direction of the gas introduced into the second line 342. As illustrated in FIG. 11, a gas g may be divided into two parts at the edge of the distribution block 338 to flow along the first and second surfaces 338a and 338b. A portion of the gas g may flow in a right direction of the distribution block 338, and the remaining portion may flow in a left direction of the distribution block 338. Then, the gases are introduced into the edge region 332b. According to the current embodiment, the distribution block 338 may have a diamond shape in section.

Figure 12:
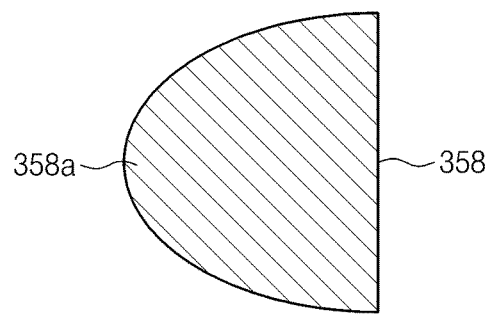
FIGS. 12 and 13 are cross-sectional views of a distribution block according to another embodiment of the present invention.
Figure 13:
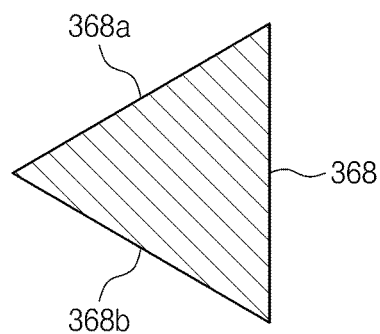

FIGS. 12 and 13 are cross-sectional views of a distribution block according to another embodiment of the present invention.

Referring to FIG. 12, a distribution block 358 has a semicircular shape in section. One surface 358a of an arc shape may face a flow direction of a gas introduced into a second line 342. The gas may be divided into two parts. A portion of the gas may flow to one side of the distribution block 358, and the remaining portion of the gas may flow to the other side of the distribution block 358.

Referring to FIG. 13, the distribution block 368 may have a triangular shape in section. A first surface 368a and second surface 368b of the distribution block 368 may be angled at a predetermined angle. An edge of the distribution block 368 at which the first and second surfaces 368a and 368b meet each other may face a flow direction of a gas introduced into the second line 342. The gas may be divided into two parts at the edge of the distribution block 368 to flow along the first and second surfaces 368a and 368b.

Figure 14:
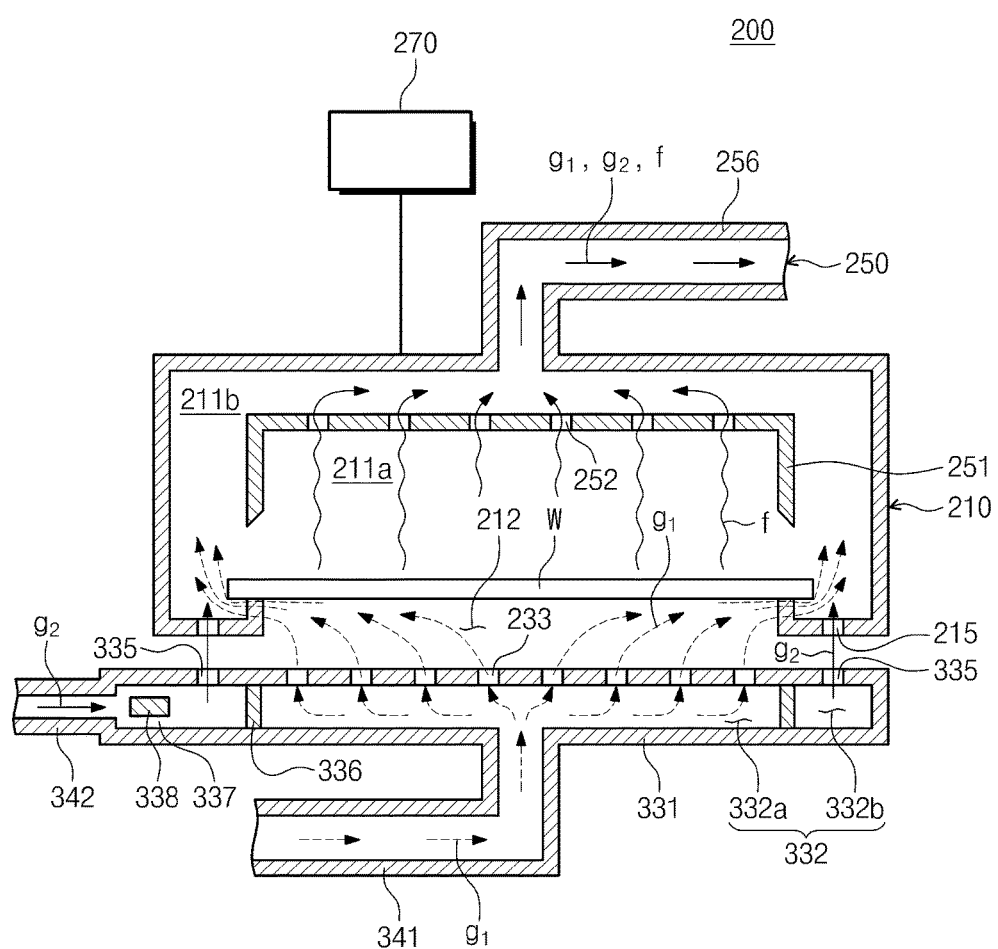
FIG. 14 is a view of a state in which a state in which a substrate is cooled according to another embodiment of the present invention.

FIG. 14 is a view of a state in which a state in which a substrate is cooled according to another embodiment of the present invention.

Referring to FIG. 14, a cooling gas g1 is supplied into a central region 332a of a gas injection block 331 through a first line 341. Also, the cooling gas g1 is supplied into an edge region 332b of the gas injection block 331 through a second line 342. The cooling gas g1 supplied into the central region 332a may pass through injection holes 333 and then be supplied into a gas inflow hole 212. The cooling gas g1 may be bumped against a substrate W and introduced into a cooling chamber 210 through a space between the substrate W and support pins 214. In this process, the substrate W may be quickly cooled by the cooling gas g1.

A gas g2 supplied into the edge region 332b of the gas injection block 331 may pass through air curtain holes 335 and then be introduced into air injection holes 215. The gas g2 may surround the cooling gas g1 supplied into the gas inflow hole 212 to prevent the surrounding air from being introduced into the gas inflow hole 212. Since a flow of the gas g2 supplied from the air curtain holes 355 is quicker than that of the gas g1 supplied from the injection holes 333, the introduction of the surrounding air into the gas inflow hole 212 may be effectively blocked.

Figure 15:
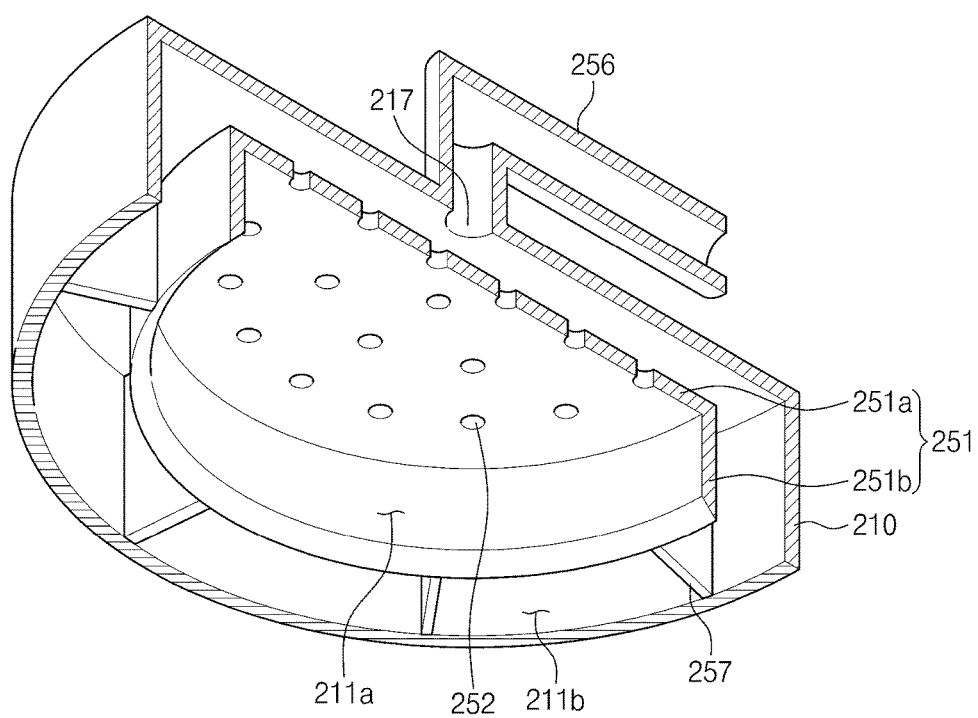
FIG. 15 is a cross-sectional view of a gas exhaust part according to another embodiment of the present invention.

FIG. 15 is a cross-sectional view of a gas exhaust part according to another embodiment of the present invention.

Referring to FIG. 15, a gas exhaust part 250 further includes a partition plate 257. The partition plate 257 may be disposed in a space 211b between a cooling chamber 210 and a partition part 251. The partition plate 257 may be provided in plurality. The plurality of partition plates 257 may be radially disposed with respect to a center of an inflow hole 217. The partition plates 257 are disposed at the same interval along a circumference of the inflow hole 217.

According to the current embodiment, the partition plates 257 may be disposed between a sidewall of the cooling chamber 210 and a second partition wall 251b. The partition plates 257 may partition a second region 211b into a plurality of spaces. Here, the partitioned spaces may have the same volume. A cooling gas introduced into the cooling chamber 210 may be introduced into the partitioned spaces at the same flow rate to flow into an inflow hole 217. Thus, a flow of the gas within the cooling chamber 210 may be uniform to prevent an eddy current from occurring. The gas flow may minimize the introduction of particles onto a substrate W.

Figure 16:
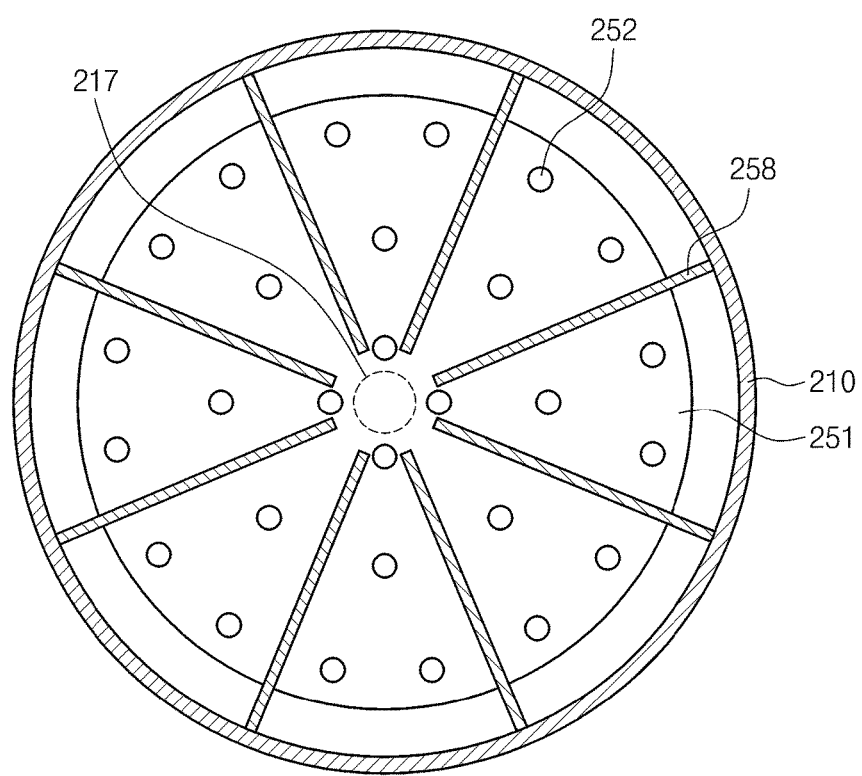
FIG. 16 is a cross-sectional view of a gas exhaust part according to further another embodiment of the present invention.

FIG. 16 is a cross-sectional view of a gas exhaust part according to further another embodiment of the present invention.

Referring to FIG. 16, each of partition plates 258 may have one end contacting an inner side surface of a cooling chamber 210 and the other end disposed at a position that is adjacent to an inflow hole 217. The partition plates 268 may guide a flow of the cooling gas up to a position that is adjacent to the inflow hole 217.

Figure 17:
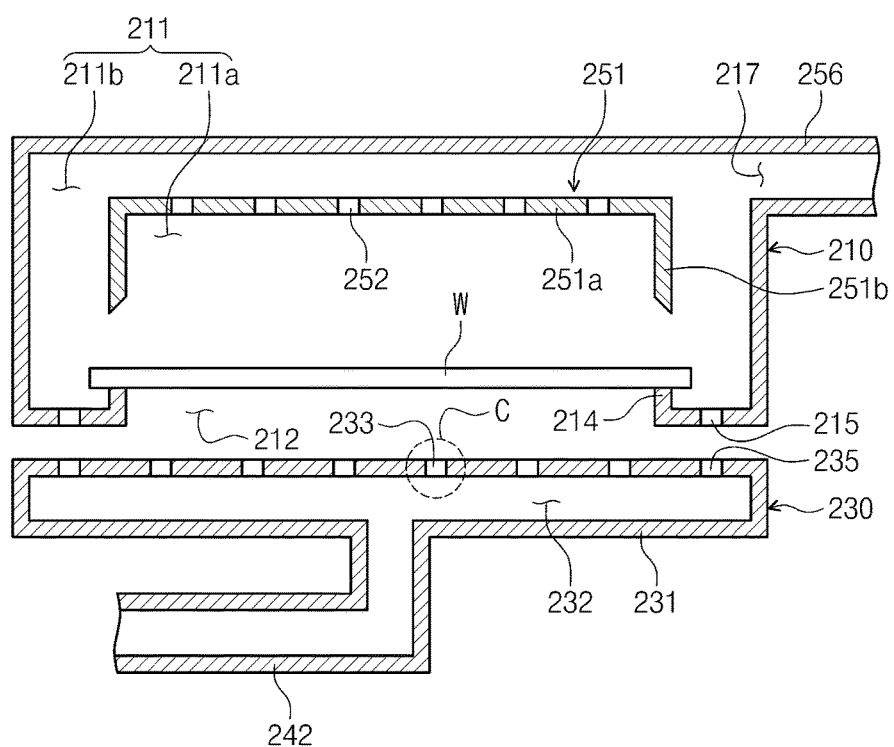
FIG. 17 is a cross-sectional view of a cooling unit according to further another embodiment of the present invention.

FIG. 17 is a cross-sectional view of a cooling unit according to further another embodiment of the present invention.

Referring to FIG. 17, an inflow hole 217 may be defined in an upper portion of a sidewall of a cooling chamber 210. A gas exhaust line 256 is connected to the sidewall of the cooling chamber 210 to exhaust a gas in a lateral direction of the cooling chamber 210.

Figure 18:
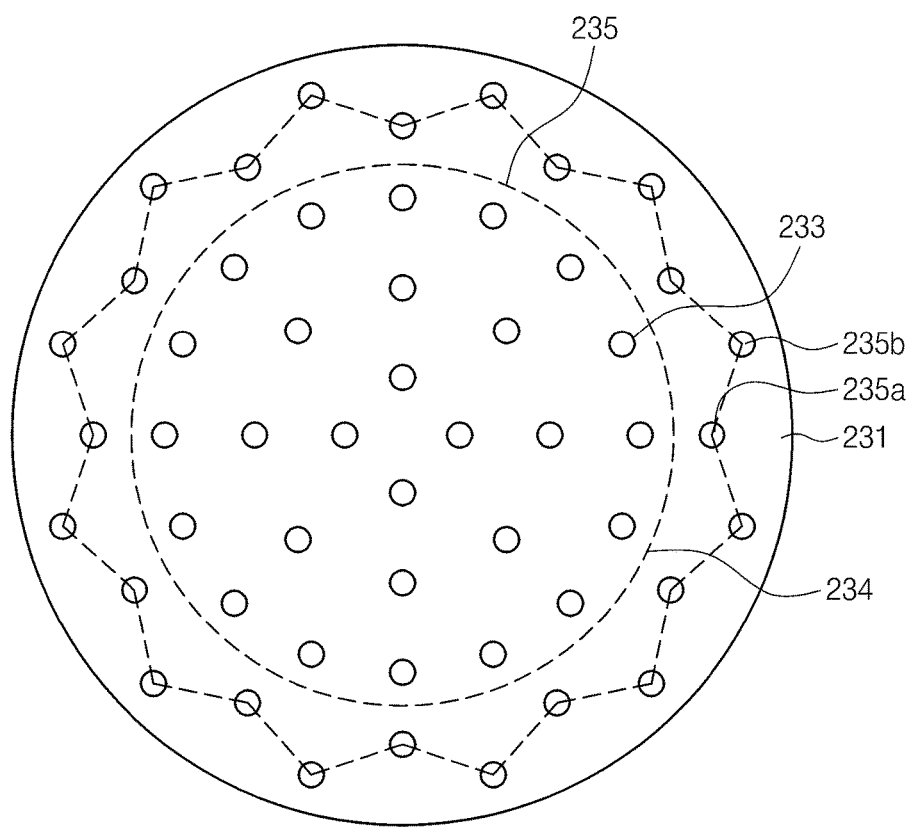
FIG. 18 is a plan view of a gas injection block according to further another embodiment of the present invention.

FIG. 18 is a plan view of a gas injection block according to further another embodiment of the present invention.

Referring to FIG. 18, air curtain holes 235a and 235b are arranged in a zigzag form along a circumference of a gas injection block 231. The first air curtain holes 235a may be arranged in a ring shape at positions that are adjacent to a center of a gas injection block 231 than the second air curtain holes 235b. The second air curtain holes 235b are disposed between the first air curtain holes 235a. Also, the second air curtain holes 235b may be combined with each other and then arranged in a ring shape.

Figure 19:
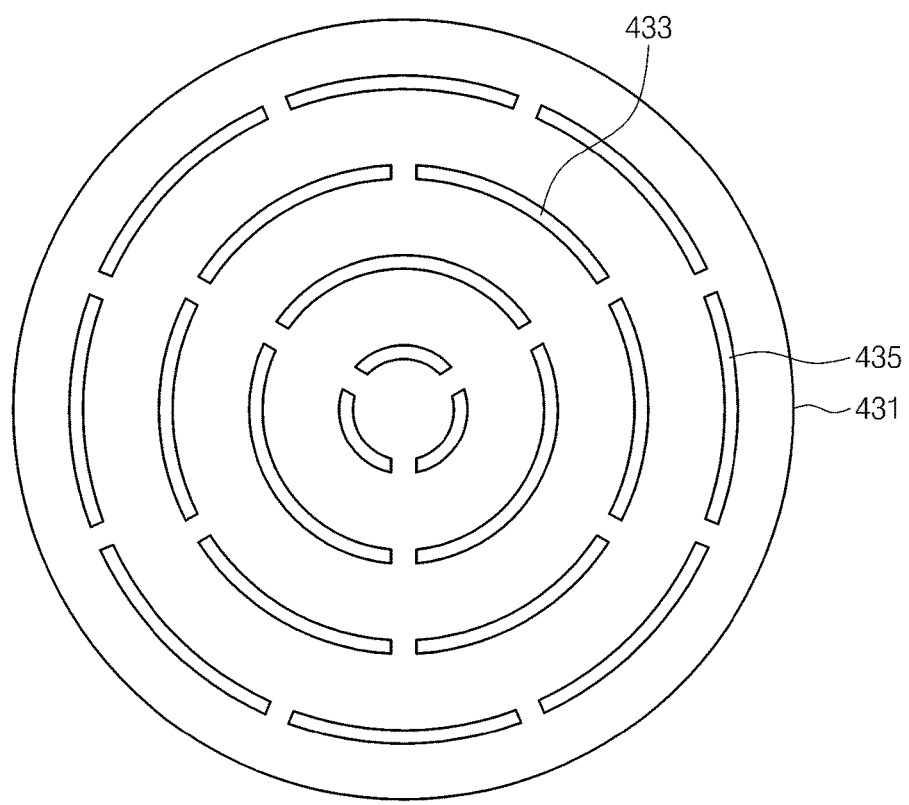
FIG. 19 is a plan view of a gas injection block according to further another embodiment of the present invention.

FIG. 19 is a plan view of a gas injection block according to further another embodiment of the present invention. Referring to FIG. 19, injection holes 433 and air curtain holes 435 may be provided as slot holes, each of which has an arc shape. The injection holes 433 may be combined with each other form a concentric shape and arranged in a ring shape of which radii are different from each other. The air curtain holes 435 are arranged in a ring shape in an edge area of the gas injection block 431.

Figure 20:
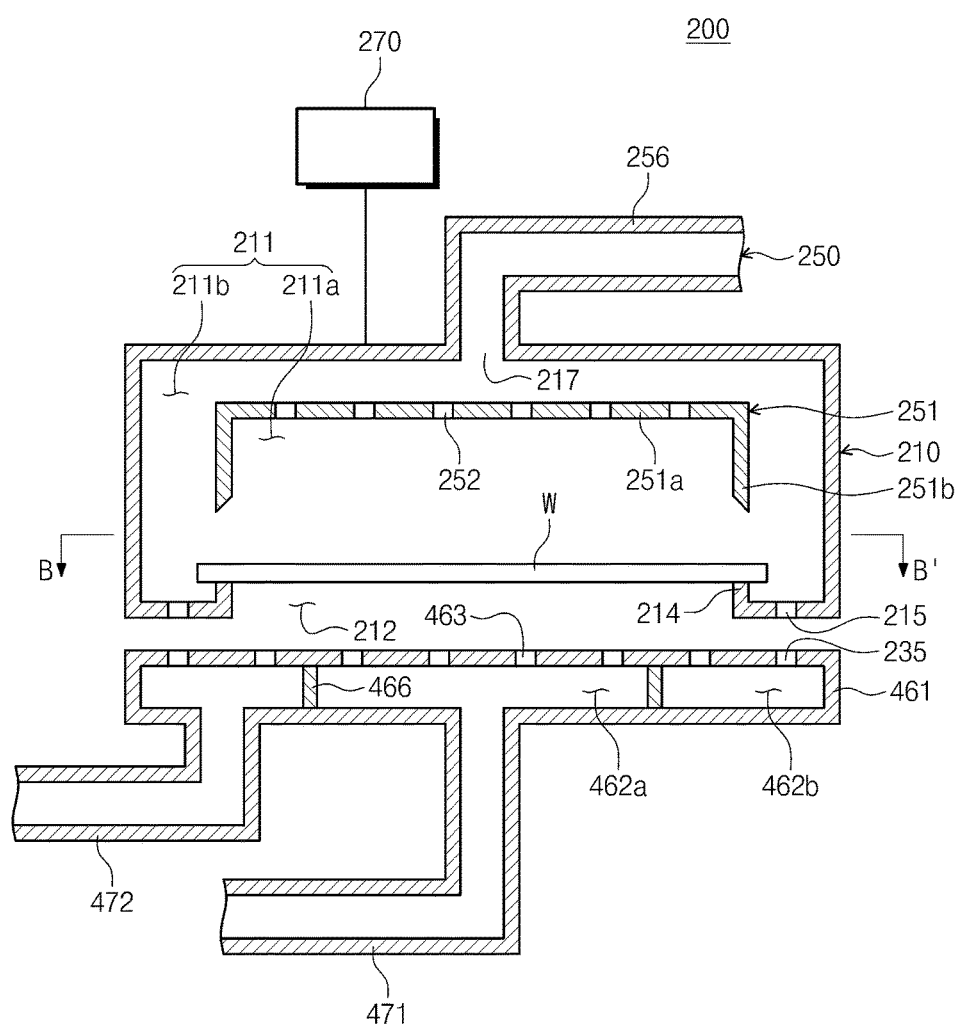
FIG. 20 is a cross-sectional view of a cooling unit according to further another embodiment of the present invention.

FIG. 20 is a cross-sectional view of a cooling unit according to further another embodiment of the present invention.

Referring to FIG. 20, injection holes 463 are uniformly defined in an entire area of a top surface of a gas injection block 461. A partition plate 466 is disposed within the gas injection block 461 to partition a diffusion space into a central region 462a and an edge region 462b. A cooling gas is supplied into the central region 462a through a first line 471 and supplied into the edge region 462b through a second line 472. The second line 472 may supply the cooling gas at a pressure greater than that of the first line 471. The cooling gas may be injected into the injection holes 463 via the central region 462a and the edge region 462b and then supplied into a gas inflow hole 212.

Figure 21:
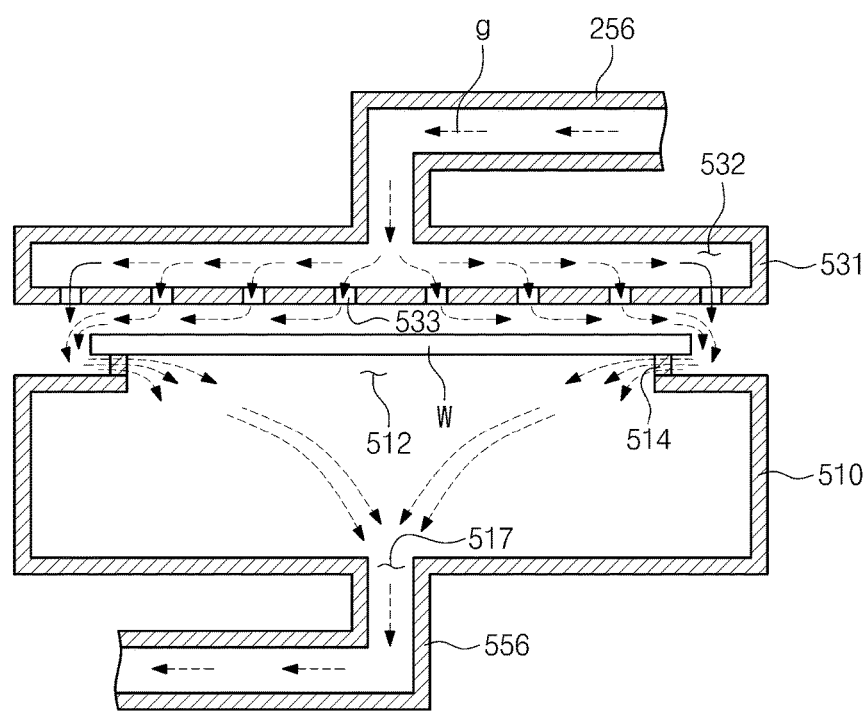
FIG. 21 is a cross-sectional view of a cooling unit according to further another embodiment of the present invention.

FIG. 21 is a cross-sectional view of a cooling unit according to further another embodiment of the present invention.

Referring to FIG. 21, a gas inflow hole 512 is defined in an upper wall of a cooling chamber 510, and an inflow hole 517 is defined in a lower wall. Support pins 514 are spaced apart from each other along a circumference of the gas inflow hole 512 to protrude upward from the upper wall of the cooling chamber 510. A substrate W is placed on upper ends of the support pins 514.

A gas injection block 531 is disposed above the cooling chamber 510. A diffusion space 532 is defined within the gas injection block 531, and injection holes 533 are defined in a bottom surface of the gas injection block 531. A cooling gas g supplied from the injection holes 533 may pass through a space between the substrate W and the support pins 514 and then be supplied into the cooling chamber 510. The cooling gas g may be introduced into an inflow hole 517 and exhausted to the outside of the cooling chamber 510 through a gas exhaust line 556.

Figure 22:
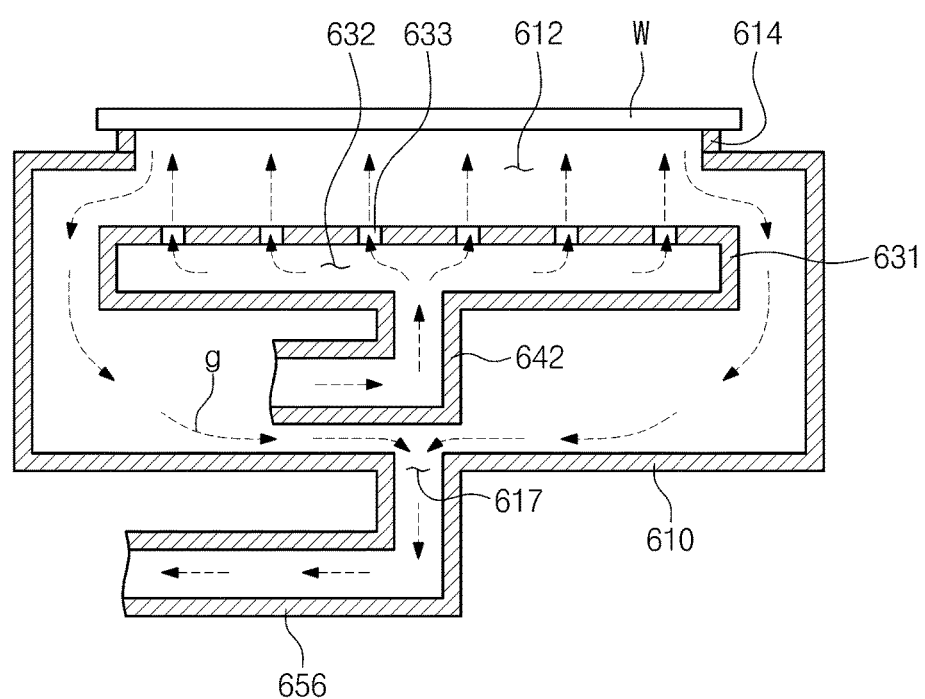
FIG. 22 is a cross-sectional view of a cooling unit according to further another embodiment of the present invention.

FIG. 22 is a cross-sectional view of a cooling unit according to further another embodiment of the present invention.

Referring to FIG. 22, a gas inflow hole 612 is defined in an upper wall of a cooling chamber 610. An inflow hole 617 is defined in a lower wall of the cooling chamber 610. Support pins 614 are spaced apart from each other along a circumference of the gas inflow hole 612 to protrude upward the upper wall of the cooling chamber 610. A substrate W is placed on upper ends of the support pins 614.

A gas injection block 631 is disposed within the cooling chamber 610. A diffusion space 632 is defined within the gas injection block 631, and injection holes 633 are defined in a top surface of the gas injection block 631. A cooling gas g supplied from the injection holes 633 is supplied onto a rear surface of the substrate W to cool the substrate W. The cooling gas g may be supplied onto the substrate W and then introduced into the inflow hole 617 via an inner space of the cooling chamber 610.

Figure 23:
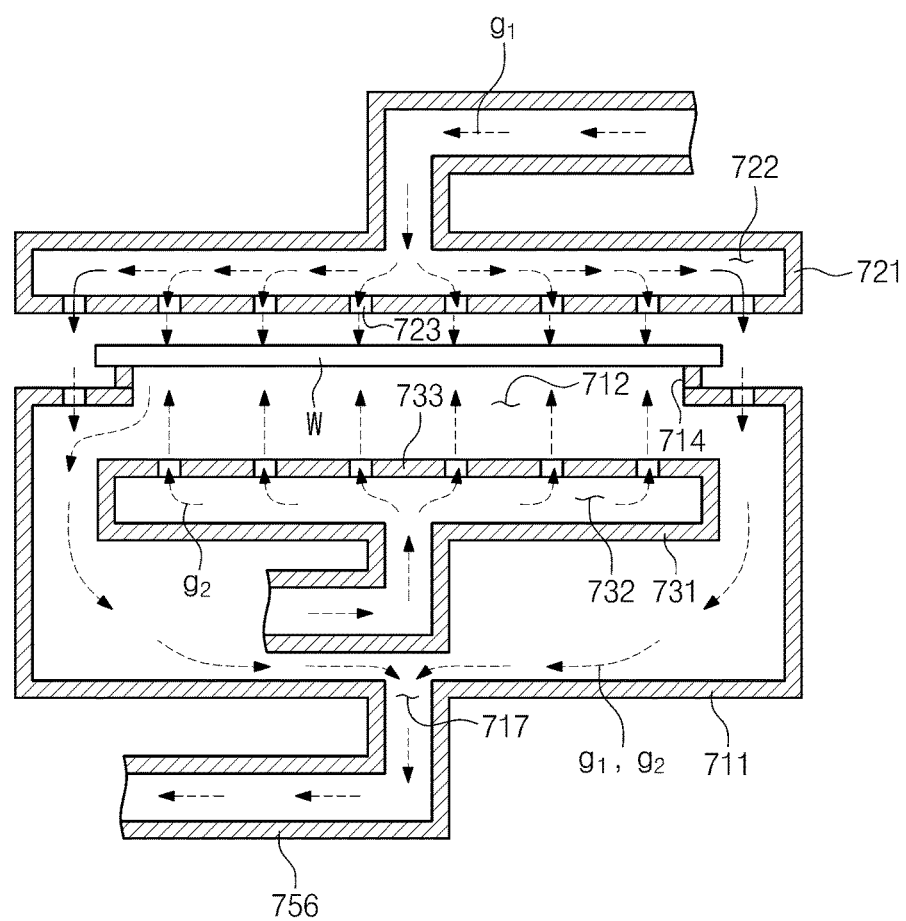
FIG. 23 is a cross-sectional view of a cooling unit according to further another embodiment of the present invention.

FIG. 23 is a cross-sectional view of a cooling unit according to further another embodiment of the present invention.

Referring to FIG. 23, a gas inflow hole 712 is defined in an upper wall of a cooling chamber 711, and an inflow hole 717 is defined in a lower wall. Support pins 714 are spaced apart from each other along a circumference of the gas inflow hole 712 to protrude upward from the upper wall of the cooling chamber 711. A substrate W is placed on upper ends of the support pins 714.

A first gas injection block 721 is disposed above the cooling chamber 711. A diffusion space 722 is defined within the first gas injection block 721, and injection holes 723 are defined in a bottom surface of the first gas injection block 721. A cooling gas g1 supplied from the injection holes 723 may be supplied onto the substrate W to pass through a space between the substrate W and the support pins 714, thereby being supplied into the cooling chamber 711.

A second gas injection block 731 is disposed within the cooling chamber 711. A diffusion space 732 is defined within the second gas injection block 731, and injection holes 733 are defined in a top surface of the second gas injection block 731. A cooling gas g2 supplied from the injection holes 733 is supplied onto a rear surface of the substrate W.

The cooling gases g1 and g2 may be introduced into an inflow hole 717 via the inside of the cooling chamber 711 and then exhausted to the outside of the cooling chamber 711 through a gas exhaust line 756.

According to the present invention, the cooling gas may be uniformly supplied onto the entire surface of the substrate to uniformly cool the substrate.

Also, according to the present invention, since the cooling gas is supplied into and exhausted from the cooling chamber at the same time, the substrate may be quickly cooled due to the forced convection of the cooling gas.

Also, according to the present invention, since the introduction of the external air is blocked, and the cooling gas flows to the outside of the upper region of the substrate, the introduction of the particles onto the substrate may be minimized.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. The above-mentioned embodiments are used to describe a best mode in implementing the present invention. The present invention can be implemented in a mode other than a mode known to the art by using another invention and various modifications required a detailed application field and usage of the present invention can be made. Therefore, the detailed description of the present invention does not intend to limit the present invention to the disclosed embodiments. Further, the appended claims should be appreciated as a step including even another embodiment.

What is claimed is:

1. A substrate treating apparatus comprising:
an equipment front end module;
a loadlock chamber;
a transfer chamber; and
a plurality of process chambers,
wherein the loadlock chamber comprises a cooling unit for cooling a substrate treated in the process chambers, and
the cooling unit comprises,
a cooling chamber having an inner space, the cooling chamber having a gas inflow hole in one surface thereof, wherein support pins on which the substrate is placed are disposed around a circumference of a gas injection hole;
a cooling gas injection part supplying a cooling gas toward the gas inflow hole; and
a gas exhaust part exhausting the cooling gas supplied into the cooling chamber and fumes generated from the substrate to the outside of the cooling chamber,
wherein the gas exhaust part is located at an opposite side of the cooling unit from the cooling gas injection part with respect to the substrate, and
wherein the inner space of the cooling chamber is above the substrate placed on the support pins;
wherein the gas injection part includes:
a gas injection block in which injection holes for injecting the cooling gas toward the gas inflow hole are defined, and a diffusion space communicating with the injection holes is defined therein, the gas injection block having a radius greater than a radius of the substrate; and
a gas supply line connected to the gas injection block to supply the cooling gas into the diffusion space;
wherein air curtain holes are defined along an edge area of the gas injection block with the injection holes therein, and air inflow holes are vertically defined in the same line as the air curtain holes in one surface of the cooling chamber facing the edge area of the gas injection block.

2. The substrate treating apparatus of claim 1, wherein the air curtain holes are arranged in a zigzag form along a circumference of the gas injection block.

3. The substrate treating apparatus of claim 1, wherein a partition plate for partitioning the diffusion space into a central region corresponding to the area in which the injection holes are defined and an edge region surrounding the central region to correspond to the area in which air curtain holes are defined is disposed within the gas injection block, and
the gas supply line comprises,
a first line supplying a gas into the central region; and
a second line supplying a gas into the edge region.

4. The substrate treating apparatus of claim 3, wherein the second line supplies the gas at a pressure greater than that of the first line.

5. The substrate treating apparatus of claim 3, wherein the gas injection block comprises an injection part connected to the second line and having a passage that gradually increases in diameter in a direction away from the second line, and
a distribution block that divides a flow of the gas supplied from the second line into two flows is disposed in the injection part.

6. The substrate treating apparatus of claim 5, wherein the distribution block comprises:
a first surface; and
a second surface that is angled at an angle with respect to the first surface,
wherein an edge of the distribution block, which is defined by the first and second surfaces that meet each other, faces a direction of the gas introduced into the injection part.

7. The substrate treating apparatus of claim 1, wherein the gas injection block supplies the cooling gas at a lower portion of the cooling chamber.

8. The substrate treating apparatus of claim 1, wherein the inner space of the cooling chamber is defined under the substrate placed on the support pins,
the gas exhaust part exhausts the gas through an inflow hole defined in a lower wall of the cooling chamber, and
the gas injection block supplies the cooling gas onto a rear surface of the substrate in the inner space of the cooling chamber.

9. The substrate treating apparatus of claim 1, wherein the inner space of the cooling chamber is defined under the substrate placed on the support pins,
the gas exhaust part exhausts the gas through an inflow hole defined in a lower wall of the cooling chamber, and
the gas injection block supplies the cooling gas onto a front surface of the substrate in the inner space of the cooling chamber.

10. The substrate treating apparatus of claim 1, wherein the gas exhaust part comprises a partition part partitioning the inner space of the cooling chamber into a first region facing the substrate and a second region surrounding the first region between the partition part and an inner side surface of the cooling chamber, the partition part having one surface in which exhaust holes, through which fumes generated from the substrate are exhausted, are defined to face the substrate.

11. The substrate treating apparatus of claim 10, wherein the partition part comprises:
a first partition wall in which the exhaust holes are defined, the first partition wall being disposed under an upper wall of the cooling chamber to face the substrate; and
a second partition wall extending downward from an edge area of the first partition wall, the second partition wall having a ring shape that is spaced a distance from a sidewall of the cooling chamber,
wherein the second partition wall has a radius less than that of the substrate.

12. The substrate treating apparatus of claim 10, wherein the gas exhaust part comprises:
a gas exhaust line connected to an inflow hole defined in a center of an upper wall of the cooling chamber to introduce the gas within the cooling chamber, thereby exhausting the gas to the outside; and
partition plates radially disposed with respect to the inflow hole to partition the second region into a plurality of spaces.

13. The substrate treating apparatus of claim 12, wherein the partition plates are disposed at the same interval along a circumference of the inflow hole.

14. The substrate treating apparatus of claim 1, wherein the support pins are configured to support the substrate during treatment of the substrate.

* * * * *